(12) United States Patent
Duskin et al.

(10) Patent No.: US 7,279,390 B2
(45) Date of Patent: Oct. 9, 2007

(54) SCHOTTKY DIODE AND METHOD OF MANUFACTURE

(75) Inventors: Mark Duskin, Scottsdale, AZ (US); Blanca Estela Kruse, Arizona City, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 354 days.

(21) Appl. No.: 11/084,471

(22) Filed: Mar. 21, 2005

(65) Prior Publication Data

US 2006/0208332 A1   Sep. 21, 2006

(51) Int. Cl.
*H01L 21/8222* (2006.01)

(52) U.S. Cl. .............................. 438/328; 257/E21.357; 257/E27.04

(58) Field of Classification Search ................ 438/328, 438/380; 257/E21.359, E21.368, E27.04
See application file for complete search history.

(56) References Cited

U.S. PATENT DOCUMENTS

| | | | |
|---|---|---|---|
| 4,357,178 A | 11/1982 | Bergeron et al. | |
| 4,720,734 A | 1/1988 | Amemiya et al. | |
| 4,899,199 A | 2/1990 | Gould | |
| 5,060,047 A | 10/1991 | Jaume et al. | |
| 5,075,740 A | 12/1991 | Ohtsuka et al. | |
| 5,614,755 A | 3/1997 | Hutter et al. | |
| 5,859,465 A | 1/1999 | Spring et al. | |
| 6,624,472 B2 | 9/2003 | Hurkx et al. | |
| 6,660,570 B2 | 12/2003 | Kim et al. | |

*Primary Examiner*—Scott B. Geyer
*Assistant Examiner*—Elias Ullah
(74) *Attorney, Agent, or Firm*—Rennie W. Dover

(57) ABSTRACT

A Schottky diode capable of sustaining a breakdown voltage of greater than about 250 volts and a method for its manufacture. An epitaxial layer disposed on a semiconductor substrate has a thickness of at least about 15 micrometers and an impurity concentration ranging from about $1\times10^{14}$ atoms per cubic centimeter to about $1\times10^{15}$ atoms per cubic centimeter. A guard ring extends from about 3 micrometers to about 15 micrometers into the epitaxial layer. A dielectric material is formed over the epitaxial layer and a portion of the dielectric material is removed to expose a portion of the guard ring and a portion of the epitaxial layer within the guard ring. An electrically conductive material is formed over the exposed portion of the epitaxial layer and an electrically conductive material is formed in contact with a bottom surface of the semiconductor substrate.

20 Claims, 4 Drawing Sheets

US 7,279,390 B2

SCHOTTKY DIODE AND METHOD OF MANUFACTURE

FIELD OF THE INVENTION

This invention relates, in general, to a semiconductor device and, more particularly, to a Schottky diode.

BACKGROUND OF THE INVENTION

Schottky diodes are well suited for use in high frequency applications because they have short reverse recovery times and low forward voltages, i.e., low losses. However, they have breakdown voltages of less than 200 volts which limits their use to low voltage applications. Schottky diodes are typically comprised of a high work function metal in contact with an N-type conductivity epitaxial layer which is grown on a substrate material of N-type conductivity. Techniques for increasing the breakdown voltage have resulted in an increase in the forward voltage and a decrease the switching speed of the Schottky diode.

Accordingly, it would be advantageous to have a Schottky diode capable of withstanding a large reverse bias voltage while maintaining a low forward voltage drop and fast switching characteristics. It would be of further advantage for the method of manufacturing the Schottky diode to be cost and time efficient and compatible with Schottky diode manufacturing processes.

SUMMARY OF THE INVENTION

The present invention satisfies the foregoing need by providing a Schottky diode having a breakdown voltage of greater than about 250 volts and a method for manufacturing the Schottky diode. In accordance with one embodiment, the present invention comprises a method for manufacturing a Schottky diode having a breakdown voltage of at least about 250 volts. A semiconductor material of a first conductivity type having first and second major surfaces is provided, wherein the semiconductor material comprises an epitaxial layer having a thickness of at least about 15 micrometers and an impurity concentration ranging from about $1 \times 10^{14}$ atoms per cubic centimeter to about $1 \times 10^{15}$ atoms per cubic centimeter disposed on a semiconductor substrate. A guard ring of a second conductivity type is formed in the semiconductor material, wherein the guard ring extends from about 3 micrometers to about 15 micrometers into the semiconductor material from the first major surface. A first dielectric material is formed over the guard ring and an electrically conductive material is formed over a portion of the major surface and the guard ring.

In accordance with another embodiment, the present invention includes a method for manufacturing a Schottky diode having a reverse breakdown voltage of at least about 250 volts, that includes providing a semiconductor substrate of a first conductivity type having first and second major surfaces. An epitaxial layer is grown from the first major surface, wherein the epitaxial layer has a surface, a thickness of at least about 15 micrometers, and an impurity concentration of the first conductivity type ranging from about $1 \times 10^{14}$ atoms per cubic centimeter to about $1 \times 10^{15}$ atoms per cubic centimeter. A first layer of dielectric material is formed on the epitaxial layer and an opening is formed in the first layer of dielectric material, wherein the opening exposes a first portion of the epitaxial layer. A guard ring of a second conductivity type is formed in the epitaxial layer. The guard ring extends about 3 micrometers to about 15 micrometers from the surface of the epitaxial layer into the epitaxial layer. A second layer of dielectric material is formed on the exposed portion of the guard ring and an electrically conductive material is formed in contact with a portion of the epitaxial layer within the guard ring.

In accordance with yet another embodiment, the present invention includes a Schottky diode having a reverse breakdown voltage of at least about 250 volts. The Schottky diode comprises a semiconductor substrate of a first conductivity type having first and second major surfaces. An epitaxial layer of the first conductivity type is disposed on the first major surface of the semiconductor substrate. The epitaxial layer has a surface, a thickness of at least about 15 micrometers, and an impurity concentration ranging from about $1 \times 10^{14}$ atoms per cubic centimeter to about $1 \times 10^{15}$ atoms per cubic centimeter. A guard ring of a second conductivity type extends from the surface of the epitaxial layer into the epitaxial layer a distance ranging from about 3 micrometers to about 15 micrometers, wherein the thickness of the epitaxial layer, the impurity concentration of the epitaxial layer, and the depth of the guard ring into the epitaxial layer cooperate to provide the breakdown voltage of at least about 250 volts. A first electrically conductive material is disposed on a portion of the epitaxial layer within the guard ring and a second electrically conductive material is disposed on the second major surface of the semiconductor substrate.

BRIEF DESCRIPTION OF THE DRAWINGS

The present invention will be better understood from a reading of the following detailed description, taken in conjunction with the accompanying drawing figures, in which like reference numbers designate like elements, and in which.

DETAILED DESCRIPTION

Generally, the present invention provides a Schottky diode having a reverse breakdown voltage of greater than about 250 volts and a method for manufacturing the Schottky diode. In prior art Schottky diodes comprising a metal in contact with an N-type conductivity epitaxial layer disposed on an N-type conductivity substrate and a guard ring of P-type conductivity the breakdown voltages are less than 200 volts. In these devices, as the breakdown voltage exceeds 200 volts their switching speeds become unacceptably slow. The inventors have discovered a combination of parameters that yield Schottky diodes having breakdown voltages of greater than about 250 volts while maintaining their switching speeds. This unexpected result allows for the manufacture of Schottky diodes from silicon that are suitable for use in high frequency, low forward voltage, and high breakdown voltage applications.

Figure 1:
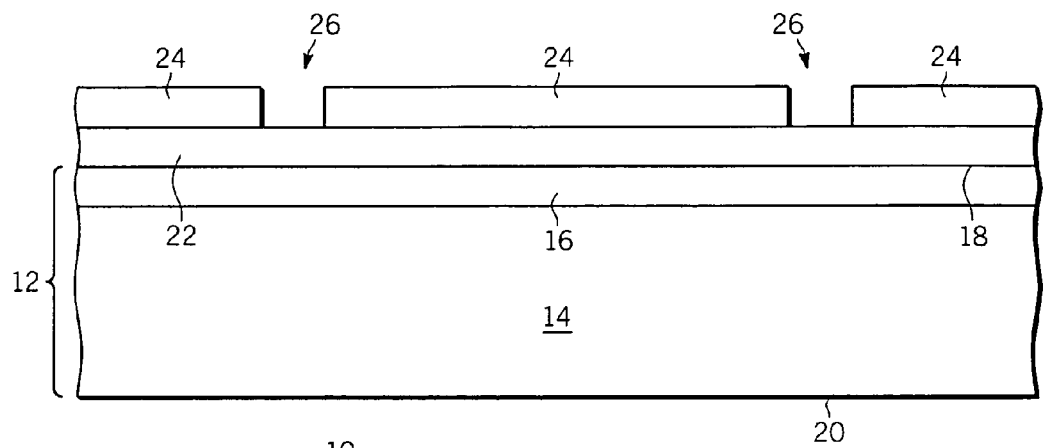
FIG. 1 is cross-sectional side view of a Schottky diode at an early stage of manufacture in accordance with an embodiment of the present invention.

FIG. 1 is a cross-sectional side view of a portion of a Schottky diode 10 at an early stage of manufacture in accordance with an embodiment of the present invention. What is shown in FIG. 1 is a semiconductor material 12 comprising a monocrystalline semiconductor substrate 14 having an epitaxial layer 16 disposed thereon. Epitaxial layer 16 has a major surface 18 which serves as the top surface of semiconductor material 12 and substrate 14 has a major surface 20 which serves as the bottom surface of semiconductor material 12. Preferably, semiconductor substrate 14 and epitaxial layer 16 are of N-type conductivity, wherein the concentration of N-type dopant or impurity material in semiconductor substrate 14 is greater than that of epitaxial layer 16. In accordance with an embodiment of the present invention, epitaxial layer 16 has a thickness of at least about 15 micrometers (μm). Preferably, substrate 14 is doped with phosphorus having a concentration of at least $1\times10^{18}$ atoms per cubic centimeter (atoms/cm$^3$) and epitaxial layer 16 is doped with phosphorus having a concentration ranging from about $1\times10^{14}$ atoms/cm$^3$ to about $1\times10^{15}$ atoms/cm$^3$. Even more preferably, epitaxial layer 16 is doped with phosphorus having a concentration of about $5\times10^{14}$ atoms/cm$^3$. It should be understood that the impurity materials of substrate 14 and epitaxial layer 16 are not limited to phosphorus but may be arsenic, antimony or other N-type conductivity material. Further, substrate 14 and epitaxial layer 16 may be doped with a P-type conductivity material rather than an N-type impurity material. It should be further understood that substrate 14 is optional and may be omitted from semiconductor component 10.

A layer of dielectric material 22 having a thickness ranging from about 40 Angstroms (Å) to about 15,000 Å is formed on epitaxial layer 16. By way of example, dielectric layer 22 is a TEOS layer formed by the decomposition of tetraethyl orthosilicate. Other suitable dielectric materials include thermally grown oxides, deposited oxides, silicon nitride (SiN), silicon oxynitride (SiON), silicon rich nitride (SiRN), silicon carbide (SiC), hydrogenated oxidized silicon carbon material (SiCOH), or the like. A layer of photoresist 24 is formed on dielectric layer 22 and patterned to have an opening 26 that exposes a portion of dielectric layer 22. In accordance with one embodiment, opening 26 has an annular shape. Thus, the cross-sectional view of FIG. 1 illustrates two portions of opening 26. It should be understood that the shape of opening 26 is not a limitation of the present invention, i.e., it can be circular, triangular, quadrilateral, pentagonal, or other polygonal shapes.

Figure 2:
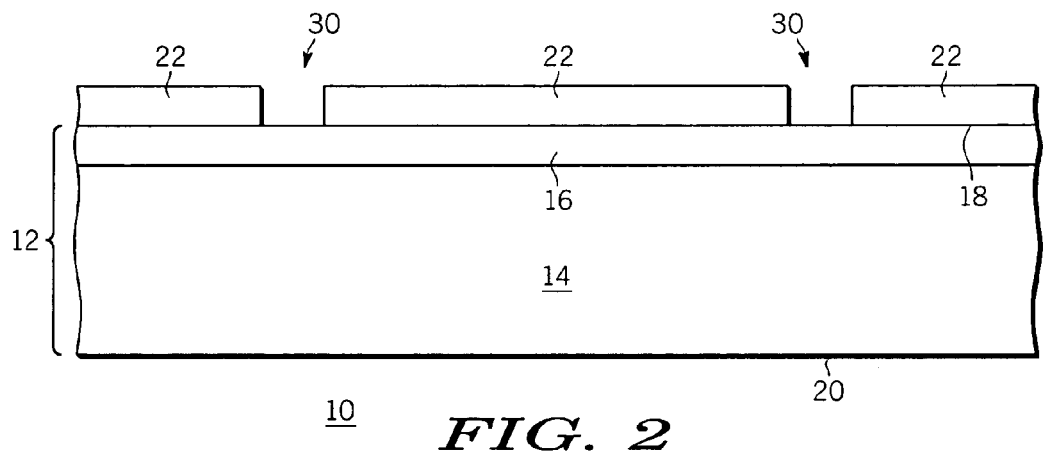
FIG. 2 is a cross-sectional side view of the Schottky diode of FIG. 1 at a later stage of manufacture.

Referring now to FIG. 2, the exposed portion of dielectric layer 22 is etched using, for example, an anisotropic reactive ion etch. In accordance with one embodiment, epitaxial layer 16 serves as an etch stop, wherein the etch forms an annular-shaped opening or groove 30 in dielectric layer 22 that exposes a portion of epitaxial layer 16. It should be understood that the etch may be either an isotropic etch or an anisotropic etch. A thin screen oxide layer may be formed on the exposed portion of epitaxial layer 16. Alternatively, the etch may be terminated to leave a thin portion of dielectric layer 22 which serves as a screen oxide.

Figure 3:
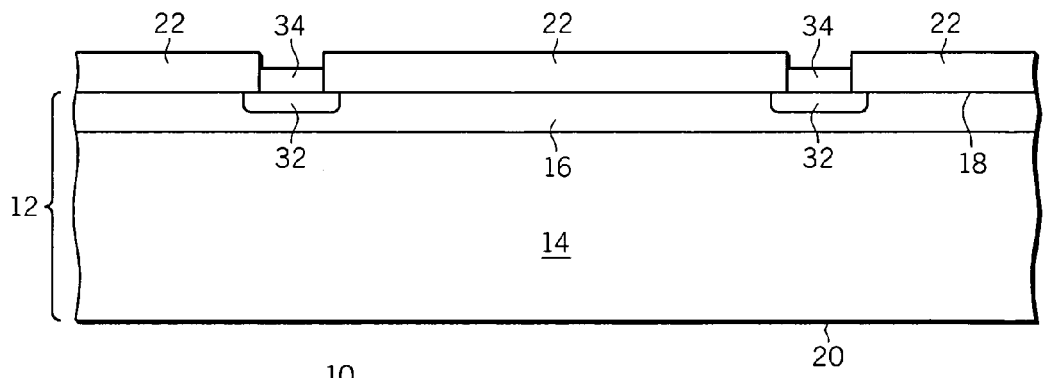
FIG. 3 is a cross-sectional side view of the Schottky diode of FIG. 2 at a later stage of manufacture.

Referring now to FIG. 3, an impurity material of P-type conductivity such as, for example, boron, is implanted through opening 30 into the exposed portions of epitaxial layer 16 to form a guard ring 32. Other suitable impurity materials of P-type conductivity include aluminum, indium, or the like. Because opening 30 has an annular shape, guard ring 32 also has an annular shape. By way of example, the boron is implanted at a dose ranging from about $7\times10^{12}$ atoms per square centimeter (atoms/cm$^2$) to about $3\times10^{13}$ atoms/cm$^2$ and at an implant energy ranging from about 40 kilo-electron Volts (KeV) to about 150 KeV. The dopant forming guard ring 32 extends at least about 5 μm into epitaxial layer 16 from surface 18. Preferably, guard ring 32 is a graded structure.

A dielectric layer 34 having a thickness ranging from about 500 Å to about 10,000 Å is formed on the exposed portion of epitaxial layer 32. In accordance with one embodiment, the formation of guard ring 32 and dielectric layer 34 occurs contemporaneously with each other. In other words, the process of diffusing the dopant that forms guard ring 32 also oxidizes the exposed portion of epitaxial layer 16, thereby forming dielectric layer 34. Like guard ring 32, dielectric layer 34 has an annular shape. It should be noted that during the formation of dielectric layer 34 silicon at the interface between dielectric layer 22 and epitaxial layer 16 is oxidized thereby increasing the thickness of dielectric layer 22.

Figure 4:
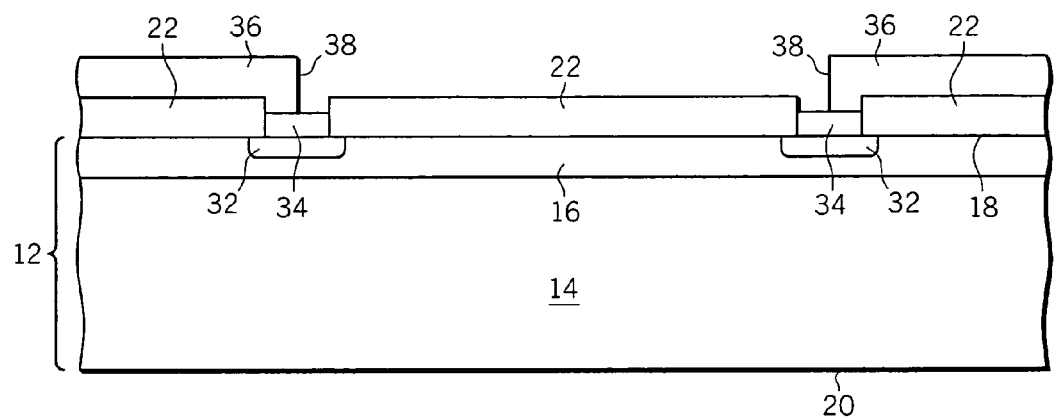
FIG. 4 is a cross-sectional side view of the Schottky diode of FIG. 3 at a later stage of manufacture.

Referring now to FIG. 4, a layer of photoresist is disposed on dielectric layers 22 and 34 and patterned to form an etch mask 36 that has a side 38 extending upward from a portion of dielectric layer 34. Etch mask 36 covers the peripheral areas of dielectric layers 22 and 34 and is absent from the portion of dielectric layer 22 that is disposed on epitaxial layer 16 within guard ring 32.

Figure 5:
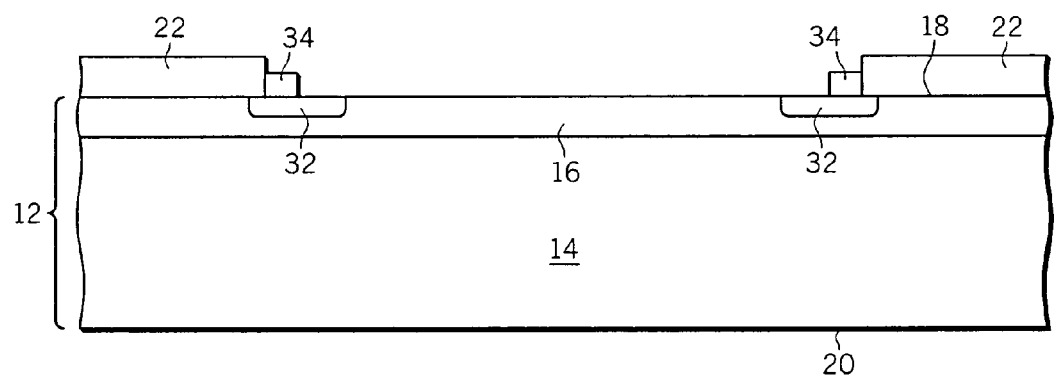
FIG. 5 is a cross-sectional side view of the Schottky diode of FIG. 4 at a later stage of manufacture.

Referring now to FIG. 5, the portions of dielectric layers 22 and 34 unprotected by etch mask 36 are etched using, for example, an anisotropic reactive ion etch. After the anisotropic etch, the portion of surface 18 of epitaxial layer 16 that is within guard ring 32 and a portion of guard ring 32 are exposed. Although the etch has been described as an anisotropic etch, this is not a limitation of the present invention, i.e., it may be an isotropic etch.

Figure 6:
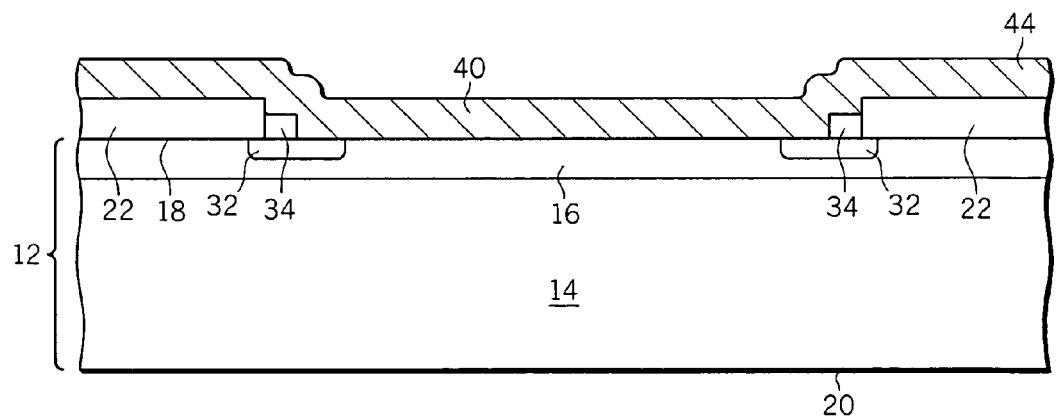
FIG. 6 is a cross-sectional side view of the Schottky diode of FIG. 5 at a later stage of manufacture.

Referring now to FIG. 6, a refractory metal layer 40 such as, for example, platinum is conformally deposited on the exposed portions of epitaxial layer 16, guard ring 32, and dielectric layer 22. Suitable refractory metals include platinum, tungsten, titanium, nickel, cobalt, or the like. Refractory metal layer 40 is heated to form a metal silicide (shown in FIG. 7) in all regions in which the refractory metal is in contact with silicon. Refractory metal layer 58 may be heated in an oven, during deposition, or during a subsequent processing step.

Figure 7:
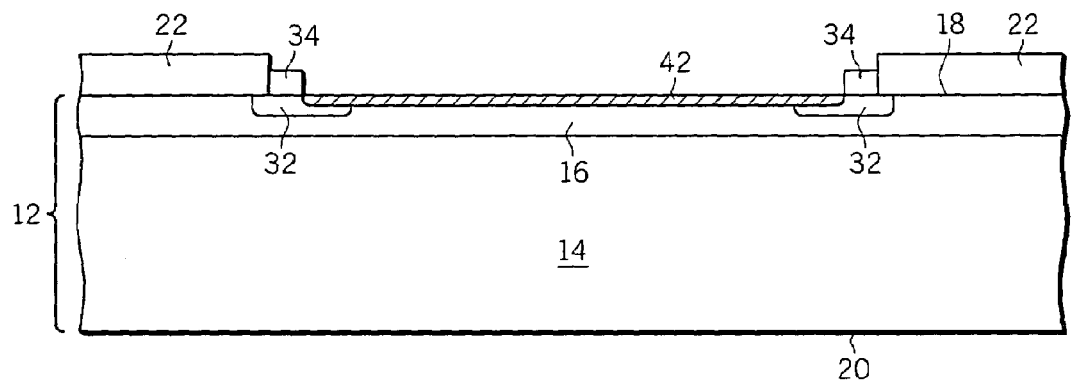
FIG. 7 is a cross-sectional side view of the Schottky diode of FIG. 6 at a later stage of manufacture.

Referring now to FIG. 7, a metal silicide layer 42 is formed from the portion of epitaxial layer 16 within guard ring 32 and the portion of guard ring 32 laterally adjacent dielectric layer 34. The portions of the refractory metal on non-silicon regions remain unreacted. The unreacted refractory metal is then removed using processes known to those skilled in the art. It should be understood that the type of silicide is not a limitation of the present invention. Suitable silicides include titanium silicide, platinum silicide, nickel silicide, cobalt silicide, tungsten silicide, combinations thereof, or the like. It should be further understood that silicide layer 42 is an optional layer that may be omitted. For example, a portion of refractory metal layer 40 can serve as the conductive metal and the portion of refractory metal layer 40 that becomes silicide serves as the barrier layer.

Figure 8:
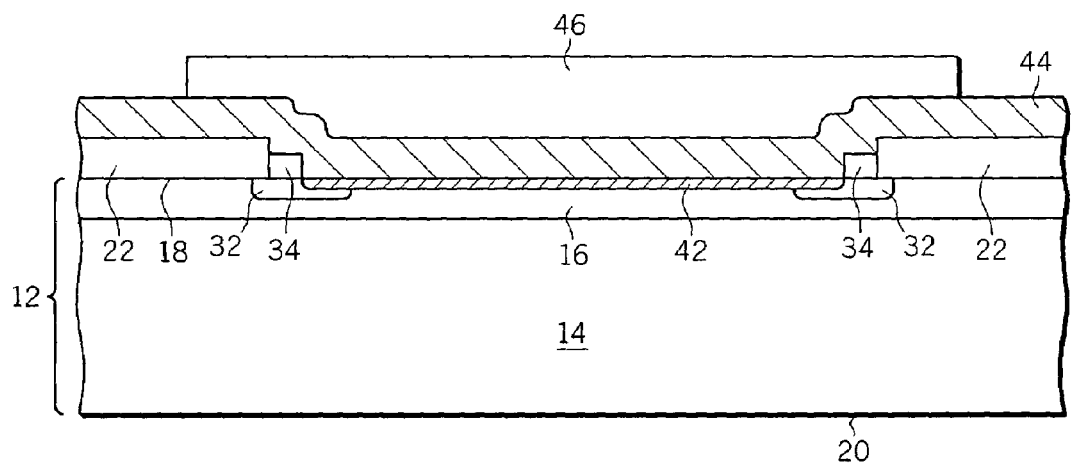
FIG. 8 is a cross-sectional side view of the Schottky diode of FIG. 7 at a later stage of manufacture.

Referring now to FIG. 8, a metal layer 44 is formed on silicide layer 42 and on dielectric layer 22. A layer of photoresist is formed on metal layer 44 and patterned to form an etch mask 46, which is disposed on the portion of metal layer 44 that is on silicide layer 42, on the remaining portion of dielectric layer 34, and on a portion of dielectric layer 22 laterally adjacent dielectric layer 34.

Figure 9:
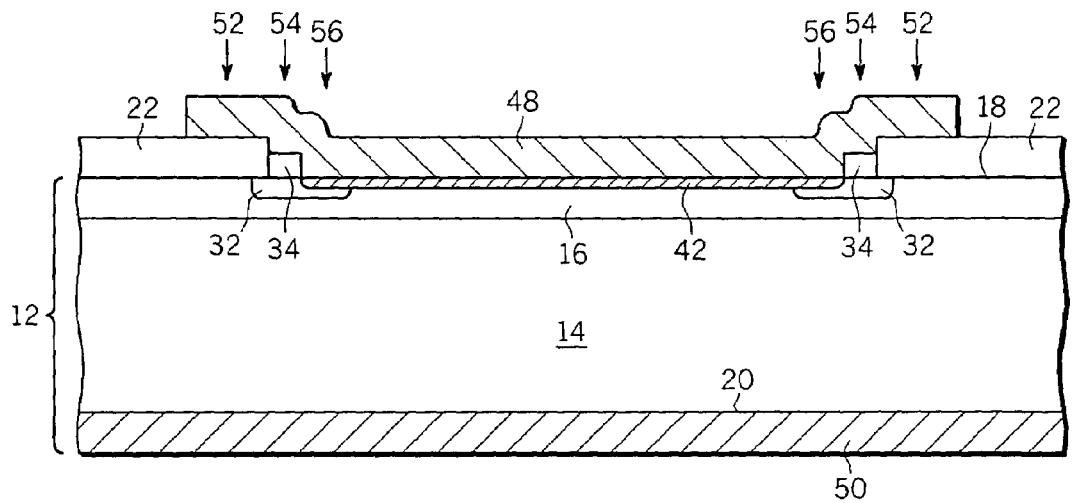
FIG. 9 is a cross-sectional side view of the Schottky diode of FIG. 8 at a later stage of manufacture.

Referring now to FIG. 9, the portion of metal layer 4 unprotected by etch mask 46 is etched to form a circular-shaped metal contact 48. Rings 52, 54, and 56 are described in conjunction with FIG. 10. A layer of electrically conductive material 50 is disposed on surface 20 of substrate 14.

Figure 10:
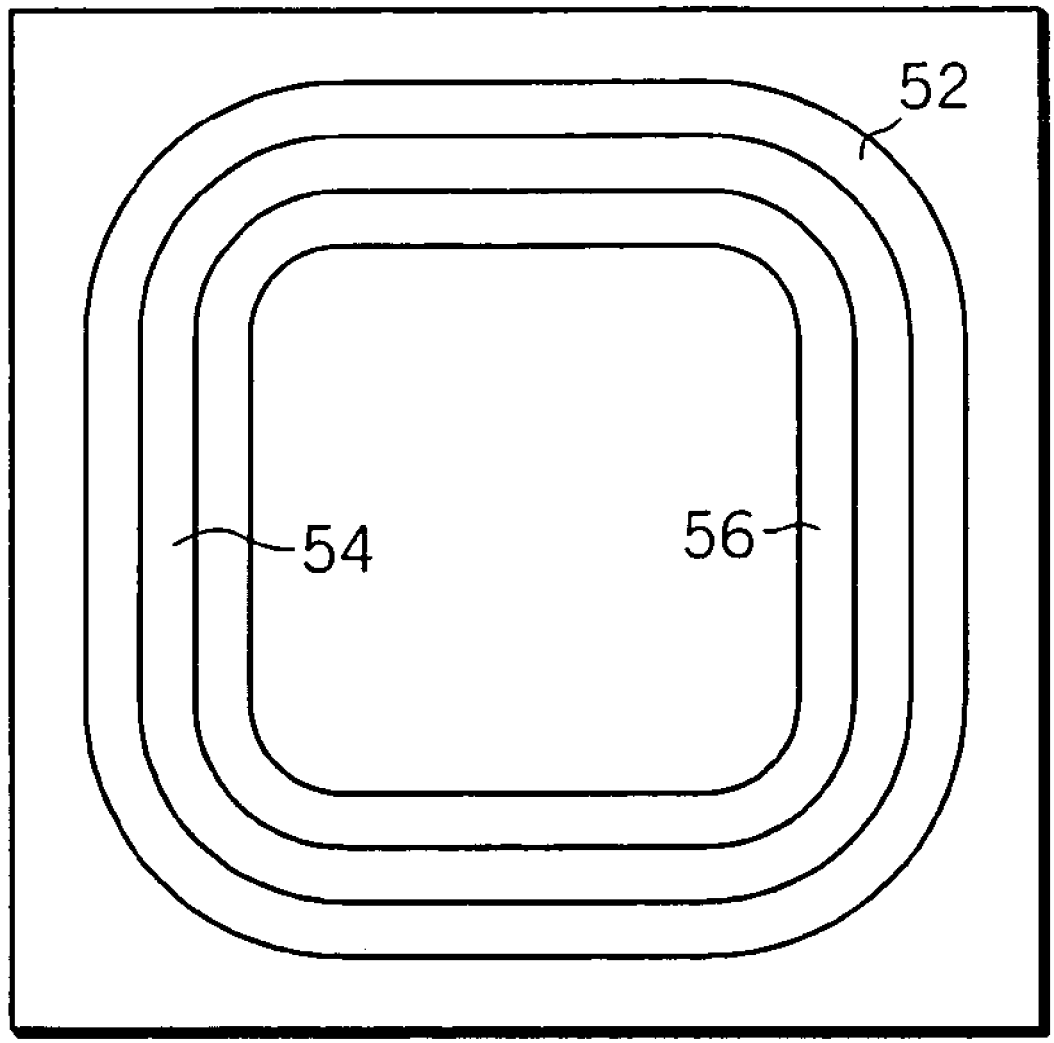
FIG. 10 is a top view of the Schottky diode of FIG. 9.

Referring now to FIG. 10, a top view of Schottky diode 10 of FIG. 9 is illustrated. What is shown in FIG. 10 are the annular or ring structures associated with Schottky diode 10. More particularly, annular region 52 results from light reflected from the peripheral portion of metal contact 48 and a portion of dielectric layer 22. Annular region 54 results from light reflected from annular-shaped dielectric layer 34 and the portion of contact 48 disposed on dielectric layer 34. Annular region 56 results from light reflected from the portion of guard ring 32 laterally adjacent dielectric layer 34 and the portion of silicide layer 42 and metal contact 48 on or over guard ring 32.

By now it should be appreciated that a Schottky diode having a breakdown voltage of greater than about 250 volts and a switching speed of less than about 200 nsec and a method for manufacturing the Schottky diode have been provided. The Schottky diode of the present invention offers these performance advantages while being manufactured using conventional semiconductor processing. Thus, it is cost efficient to manufacture. In accordance with the present invention, the thickness of the epitaxial layer in combination with the distance the guard ring extends into the epitaxial layer provides the Schottky diode with a reverse breakdown voltage of at least about 250 volts.

Although certain preferred embodiments and methods have been disclosed herein, it will be apparent from the foregoing disclosure to those skilled in the art that variations and modifications of such embodiments and methods may be made without departing from the spirit and scope of the invention. For example, the electrically conductive material is not limited to being a metal layer disposed on a silicide layer but may be a metal layer without silicide or it may be heavily doped polysilicon. It is intended that the invention shall be limited only to the extent required by the appended claims and the rules and principles of applicable law.

What is claimed is:

1. A method for manufacturing a Schottky diode having a breakdown voltage of greater than about 250 volts, comprising:
    providing a semiconductor material of a first conductivity type having first and second major surfaces, the semiconductor material comprising an epitaxial layer disposed on a semiconductor substrate, the epitaxial layer having a thickness of at least about 15 micrometers and an impurity concentration ranging from about $1\times10^{14}$ atoms per cubic centimeter to about $1\times10^{15}$ atoms per cubic centimeter;
    forming a guard ring of a second conductivity type in the semiconductor material, wherein the guard ring extends from about 3 micrometers to about 15 micrometers into the semiconductor material from the first major surface;
    forming a first dielectric material over the guard ring; and
    forming an electrically conductive material over a portion of the first major surface and the guard ring.

2. The method of claim 1, further including forming the guard ring and forming the first dielectric material at substantially the same time.

3. The method of claim 1, wherein forming the guard ring includes forming the guard ring in an annular shape.

4. The method of claim 3, wherein forming the electrically conductive material includes forming the electrically conductive material over the portion of the major surface within the annular shaped guard ring.

5. The method of claim 4, wherein forming an electrically conductive material over a portion of the major surface and the guard ring comprises:
    forming a layer of silicide from a portion of the epitaxial layer within the annular shaped guard ring; and
    forming a metal layer on the layer of silicide.

6. The method of claim 1, wherein forming the first dielectric material comprises:
    forming an oxide layer on the semiconductor material;
    forming an annular groove in the oxide layer, wherein the annular groove exposes a portion of the semiconductor material; and
    forming the first dielectric material on the portion of the semiconductor material exposed by the annular groove.

7. The method of claim 1, further including forming the oxide layer to have a first thickness and the first dielectric material to have a second thickness, the first thickness greater than the second thickness.

8. The method of claim 1, wherein the concentration of the impurity material in the epitaxial layer is about $5\times10^{14}$ atoms per cubic centimeter.

9. The method of claim 1, wherein forming the electrically conductive material over a portion of the major surface and the guard ring comprises:
    forming a layer of silicide from a portion of the epitaxial layer; and
    forming a metal layer on the layer of silicide.

10. The method of claim 1, wherein forming the electrically conductive material over a portion of the major surface and the guard ring comprises forming a metal layer on a portion of the epitaxial layer within the guard ring.

11. The method of claim 10, further including disposing an electrically conductive material on the second major surface of the semiconductor material.

12. A method for manufacturing a Schottky diode having a reverse breakdown voltage of at least about 250 volts, comprising:
    providing a semiconductor substrate having first and second major surfaces, the semiconductor substrate of a first conductivity type;
    growing an epitaxial layer from the first major surface, the epitaxial layer having a surface, a thickness of at least about 15 micrometers, and an impurity concentration of the first conductivity type ranging from about $1\times10^{14}$ atoms per cubic centimeter to about $1\times10^{15}$ atoms per cubic centimeter;
    forming a first layer of dielectric material on the epitaxial layer;
    forming an opening in the first layer of dielectric material, the opening exposing a first portion of the epitaxial layer;
    forming a guard ring of a second conductivity type in the epitaxial layer, the guard ring extending about 3 micrometers to about 15 micrometers from the surface of the epitaxial layer into the epitaxial layer;
    forming a second layer of dielectric material on the exposed portion of the guard ring; and
    forming an electrically conductive material in contact with a portion of the epitaxial layer within the guard ring.

13. The method of claim 12, wherein forming the guard ring comprises doping the epitaxial layer with an impurity material of a second conductivity type.

14. The method of claim 12, wherein forming the electrically conductive material comprises:
   forming a metal silicide from the surface of the epitaxial layer; and
   disposing a metal layer on the metal silicide.

15. The method of claim 14, further including forming an electrically conductive material on the second major surface of the semiconductor substrate.

16. The method of claim 12, wherein forming the electrically conductive material comprises forming one of a heavily doped polysilicon layer or a metal on the surface of the epitaxial layer.

17. The method of claim 12, wherein forming the electrically conductive material comprises disposing metal on the surface of the epitaxial layer.

18. A Schottky diode having a reverse breakdown voltage of at least about 250 volts, comprising:
   a semiconductor substrate of a first conductivity type having first and second major surfaces;
   an epitaxial layer of the first conductivity type disposed on the first major surface of the semiconductor substrate, the epitaxial layer having a surface, a thickness of at least about 15 micrometers, and an impurity concentration ranging from about $1 \times 10^{14}$ atoms per cubic centimeter to about $1 \times 10^{15}$ atoms per cubic centimeter;
   a guard ring of a second conductivity type extending from the surface of the epitaxial layer into the epitaxial layer a distance ranging from about 3 micrometers to about 15 micrometers, wherein the thickness of the epitaxial layer, the impurity concentration of the epitaxial layer, and the distance of the guard ring into the epitaxial layer cooperate to provide the breakdown voltage of at least about 250 volts;
   a first electrically conductive material disposed on a portion of the epitaxial layer within the guard ring; and
   a second electrically conductive material disposed on the second major surface of the semiconductor substrate.

19. The Schottky diode of claim 18, wherein the guard ring is a graded structure.

20. The Schottky diode of claim 18, wherein the first electrically conductive material comprises:
   a metal silicide; and
   a metal disposed on the metal silicide.

* * * * *